(12) United States Patent
Misumi

(10) Patent No.: US 6,841,870 B2
(45) Date of Patent: Jan. 11, 2005

(54) SEMICONDUCTOR DEVICE

(75) Inventor: Kazuyuki Misumi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/382,497

(22) Filed: Mar. 7, 2003

(65) Prior Publication Data
US 2004/0016999 A1 Jan. 29, 2004

(30) Foreign Application Priority Data
Jul. 29, 2002 (JP) ........................................ 2002-219609

(51) Int. Cl.⁷ .............................................. H01L 23/34
(52) U.S. Cl. ........................ 257/723; 257/777; 257/778
(58) Field of Search ................................ 257/723, 777, 257/778

(56) References Cited
U.S. PATENT DOCUMENTS
6,265,763 B1 * 7/2001 Jao et al. ..................... 257/676
6,507,098 B1 * 1/2003 Lo et al. ..................... 257/686

FOREIGN PATENT DOCUMENTS
JP 08/306723 11/1996
JP P2000-349228 A 12/2000

* cited by examiner

Primary Examiner—Roy Potter
(74) Attorney, Agent, or Firm—McDermott Will & Emery LLP

(57) ABSTRACT

A semiconductor device includes a first conductive pattern provided on one surface of the substrate; a second conductive pattern provided on the other surface of the substrate; at least two first semiconductor chips mounted on one surface of the substrate, and connected to the first conductive pattern; a second semiconductor chip mounted so as to stride the first semiconductor chips adjacent to each other; and a first wiring passing between the first semiconductor chips adjacent to each other, and through openings formed in the substrate, an end thereof being connected to the surface of the second semiconductor chip facing the substrate, and the other end being connected to the second conductive pattern.

20 Claims, 11 Drawing Sheets

SEMICONDUCTOR DEVICE

BACKGROUND OF THE INVENTION

1. Field of the Invention

The present invention relates to a semiconductor device, and more specifically to a semiconductor device where a plurality of semiconductor chips are mounted on a substrate.

2. Background Art

As a package of high-speed DRAMs or the like, a package using a BOC (board on chip) structure has been known. FIG. 15 is a schematic sectional view showing a package using a BOC structure. In a package having a BOC structure, a substrate 101 having an opening 101a in the center portion thereof is used. A semiconductor chip 102 is die-bonded upside down on the substrate 101, and disposed so that the location of the center pad 102a corresponds to the location of the opening 101a of the substrate 101. The semiconductor chip 102 is electrically connected to the substrate 101 with a gold wire 103, and the gold wire 103 is passed through the opening 101a, and wire-bonded to the center pad 102a and the bonding finger 101b on the back of the substrate 101.

FIG. 16 is a plan showing the surroundings of the opening 101a viewed from the bottom before the package of FIG. 15 is resin-sealed. Gold wires 103 drawn from center pads 102a are connected to the bonding fingers 101b of the substrate 101, and the bonding fingers 101b are connected to the patterns or the like whereon ball bumps 104 shown in FIG. 15 are disposed. As FIG. 15 shows, the back of the semiconductor chip 102 and the surroundings of the opening 101a are sealed with the sealing resin 105.

FIG. 17 is a schematic sectional view showing a substrate-type package. In a substrate-type package, a semiconductor chip 102 is die-bonded on the substrate 101 with the center pad 102a thereof facing up. A gold wire 103 connected to the center pad 102a is drawn on the surface of the semiconductor chip 102, and connected to a bonding finger on the substrate 101 positioned outside the semiconductor chip 102.

FIG. 18 is a schematic sectional view showing a multi-chip package using a BOC structure. This multi-chip package has a constitution wherein the semiconductor chip 102 of FIG. 17 is die-bonded on the semiconductor chip 102 of FIG. 15, and the two semiconductor chips 102 provided with a center pad 102a are die-bonded with one upside down. As FIG. 18 shows, the center pad 102a of the upper semiconductor chip 102 is connected to the upper surface of the substrate 101 with a gold wire 103. The gold wire 103 connected to the center pad 102a of the lower semiconductor chip 102 is connected to the lower surface of the substrate 101 through the opening 101a.

However, in the multi-chip structure shown in FIG. 18, stacking two semiconductor chips 102 raises the position of the center pad 102a of the upper semiconductor chip 102, and in order to connect the center pad 102a to the substrate 101, the gold wire 103 must be sufficiently long. Since the gold wire 103 is supported only by wire-bonded portions on the both ends, the fall (gold wire flowing) is likely to occur in the middle between wire-bonded portions when the total length of the gold wire 103 becomes long. Thereby, a problem of short-circuiting between gold wires 103 adjacent to each other, or between a gold wire 103 and the edge of the semiconductor chip 102 has risen.

In addition, since the wiring drawing length of the gold wire 103 to be connected to the lower semiconductor chip 102 is longer than the length of the gold wire 103 to be connected to the upper semiconductor chip 102, timing difference in signals between upper semiconductor chip 102 and lower semiconductor chip 102 is significant especially during high-speed operations. Thereby, a problem of low reliability of the device operation has risen.

SUMMARY OF THE INVENTION

The object of the present invention is to solve the above-described problems, and to provide a highly reliable small high-density multi-chip package using a BOC structure.

According to one aspect of the present invention, a semiconductor device wherein a plurality of semiconductor chips are mounted on a substrate comprises a first conductive pattern, a second conductive pattern, at least two first semiconductor chips, a second semiconductor chip, and a first wiring. The first conductive pattern is provided on one surface of the substrate. The second conductive pattern is provided on the other surface of the substrate. The first semiconductor chips are mounted on one surface of the substrate, and connected to the first conductive pattern. The second semiconductor chip is mounted so as to stride on the first semiconductor chips adjacent to each other. The first wiring is passing between the first semiconductor chips adjacent to each other, and through an opening formed in the substrate. An end of the first wiring is connected to the surface of the second semiconductor chip facing the substrate, and the other end being connected to the second conductive pattern.

According to another aspect of the present invention, a semiconductor device wherein a semiconductor chip is mounted on a substrate comprises a conductive pattern, a semiconductor chip, a first wiring, a plurality of patterns for bonding, a second wiring. The conductive pattern is provided on one surface of the substrate. The semiconductor chip is mounted on the other surface of the substrate. The first wiring is passing through an opening formed in the substrate. An end of the first wiring is connected to the surface of the semiconductor chip facing the substrate, and the other end being connected to the conductive pattern. The patterns for bonding consists of the conductive pattern, whereto a plurality of the first wirings are respectively connected. The second wiring connects at least two of the plurality of patterns for bonding.

According to another aspect of the present invention, a semiconductor device wherein a semiconductor chip is mounted on a substrate comprisies a conductive pattern, a semiconductor chip, a wiring, a plurality of patterns for bonding, a connecting pattern. The conductive pattern is provided on one surface of the substrate. The semiconductor chip is mounted on the other surface of the substrate. The wiring is passing through an opening formed in the substrate, an end thereof is connected to the surface of the semiconductor chip facing the substrate, and the other end is connected to the conductive pattern. The plurality of patterns for bonding consist of the conductive pattern, whereto a plurality of the wirings are respectively connected. The connecting pattern consists of the conductive pattern, and for connecting at least two of the plurality of patterns for bonding. The connecting pattern is provided between the patterns for bonding and the edge of the opening.

According to another aspect of the present invention, a semiconductor device wherein a semiconductor chip is mounted on a substrate comprises a conductive pattern, a semiconductor chip, a wiring, a plurality of patterns for bonding, and a plurality of conductive balls. The conductive pattern is provided on one surface of the substrate. The semiconductor chip is mounted on the other surface of the substrate. The wiring is passing through an opening formed in the substrate, an end of the wiring is connected to the surface of the semiconductor chip facing the substrate, and the other end being connected to the conductive pattern. The patterns for bonding consists of the conductive pattern, whereto a plurality of the wirings are respectively connected. The conductive balls are fixed on the conductive pattern, and disposed along the opening. The patterns for bonding are formed in the region between the area where the plurality of conductive balls are disposed and the edge of the opening. In the direction of the presence of the opening, one or more of the patterns for bonding is positioned between two of the balls adjacent to each other.

Other and further objects, features and advantages of the invention will appear more fully from the following description.

DETAILED DESCRIPTION OF THE PREFERRED EMBODIMENTS

Figure 1:
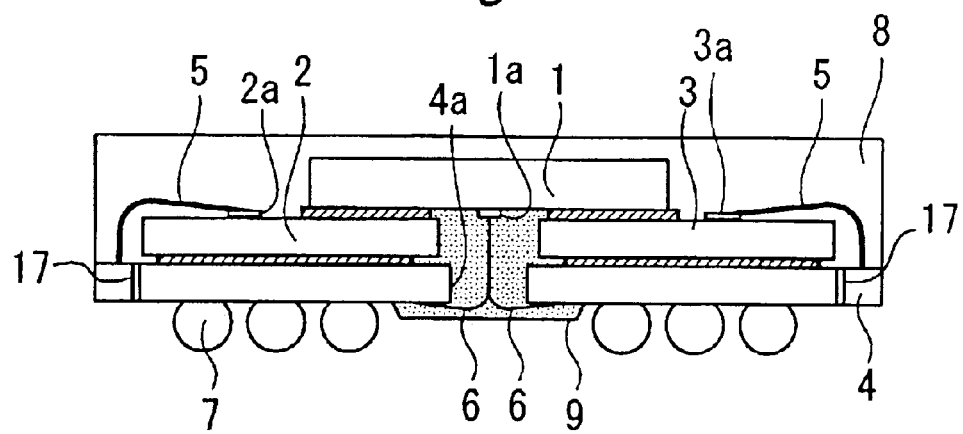
FIG. 1 is a schematic sectional view showing a semiconductor device according to First Embodiment of the present invention.

Some embodiments of the present invention will be described in detail below referring to the drawings. The embodiments described below are not intended to limit the present invention.

First Embodiment

FIG. 1 is a schematic sectional view showing a semiconductor device according to First Embodiment of the present invention. The semiconductor device is constituted from a multi-chip package using a BOC structure, and comprises a semiconductor chip 1, a semiconductor chip 2, a semiconductor chip 3, and a substrate 4. The substrate 4 is a wiring substrate having predetermined conductive patterns formed on the upper and lower surfaces thereof, and the semiconductor chips 1, 2, and 3 are disposed on the substrate 4 and electrically connected to the conductive patterns.

An opening 4a is formed in the vicinity of the center portion of the substrate 4, and the semiconductor chip 2 and the semiconductor chip 3 are disposed on the both sides of the opening 4a, respectively. All of the semiconductor chips 1, 2, and 3 are of center-pad specifications. The semiconductor chips 2 and 3 are die-bonded on the substrate 4 in the state where the chip surface having center pads 2a and 3a for electrode is facing upward. The semiconductor chip 1 is die-bonded on the semiconductor chips 2 and 3, and is disposed in the state where the center pad 1a thereof is facing downward so as to position on the opening 4a. Conductive balls 7 for mounting are fixed on the lower surface of the substrate 4.

The center pads 2a and 3a of the semiconductor chips 2 and 3 are connected to bonding fingers on the upper surface of the substrate 4 by wire bonding using gold wires 5. The center pad 1a of the semiconductor chip 1 is connected to bonding fingers on the lower surface of the substrate 4 by wire bonding using gold wires 6. The gold wires 6 start from the center pad 1a and pass between the semiconductor chips 2 and 3 and through the opening 4a to the bonding fingers on the lower surface of the substrate 4.

The semiconductor chips 1, 2, and 3 on the substrate 4 are sealed using a sealing resin 8. The lower surface of the substrate 4 is sealed using a sealing resin 9, and the sealing resin 9 fills the space between the semiconductor chips 2 and 3 and the opening 4a. The sealing resin 9 also seals the bonding fingers on the lower surface of the substrate 4 and the gold wires 6.

When the semiconductor chip 1 is connected to the bonding fingers on the substrate 4, after the semiconductor chip 1 is die-bonded on the semiconductor chips 2 and 3, the substrate 4 is turned upside down and the center pad 1a of the semiconductor chip 1 is wire-bonded to the substrate 4 using the gold wire 6.

By thus disposing the semiconductor chips 2 and 3 on the both sides of the opening 4a, and passing the gold wire 6 between the semiconductor chips 2 and 3 and through the opening 4a, the wiring length of the gold wire 6 can be minimized. Since the distance between wire-bonded portions at the both ends of the gold wire 6 is thereby shortened, the gold wire 6 can be supported stably, and the occurrence of the fall (gold wire flowing) of the gold wire 6 can be prevented between the wire-bonded portions. Therefore, the short-circuiting of gold wires 6 themselves adjacent to each other, and the short-circuiting between gold wires 6 and the edges of the semiconductor chips 2 and 3 can be prevented, and the reliability of the semiconductor device can be improved.

Shortening the wiring drawing length from the semiconductor chip 1 to the substrate 4 results in the structure advantageous for increasing the speed of the operation by the chips. Furthermore, since the length of the gold wire 6 can be made substantially the same as the length of the gold wire 5, the occurrence of the timing difference of signals between the semiconductor chip 1 and the semiconductor chips 2 and 3 can be prevented.

Moreover, since there is no need to draw the gold wire outside the semiconductor chip 1, the space outside the semiconductor chip 1 can be reduced. Thereby, a small and high-density multi-chip package of the BOC structure can be constituted.

Although an example wherein two semiconductor chips 2 and 3 are mounted on a substrate 4 is shown in FIG. 1, three or more semiconductor chips can be disposed side by side on the substrate 4. Similarly, although an example wherein a semiconductor chip 1 is mounted on semiconductor chips 2 and 3 is shown in FIG. 1, two or more semiconductor chips can be mounted on semiconductor chips 2 and 3.

MODIFIED EXAMPLE 1

Figure 2:
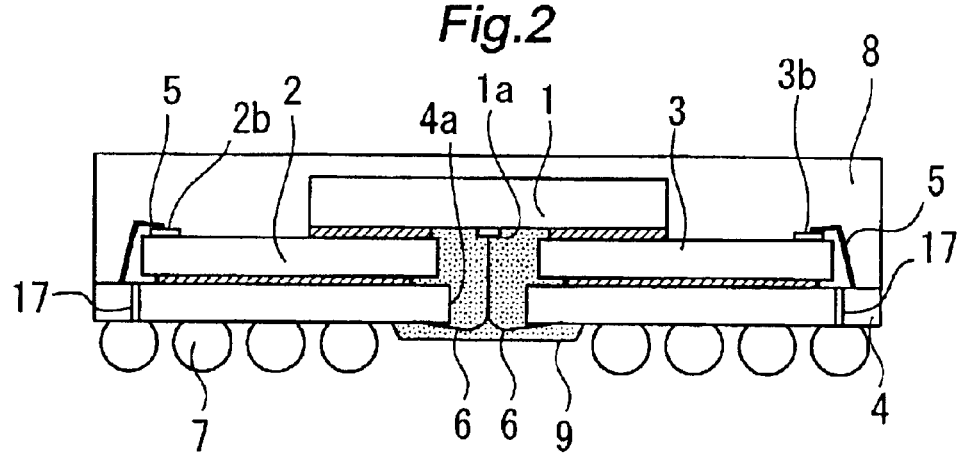
FIG. 2 is a schematic sectional view showing Modified Example 1 of First Embodiment.

FIG. 2 is a schematic sectional view showing Modified Example 1 of First Embodiment. Modified Example 1 is a semiconductor chip of specifications wherein circumferential pads 2b and 3b are provided on the semiconductor chips 2 and 3 shown in FIG. 1. By allowing the semiconductor chips 2 and 3 to be a chip of circumferential pad specifications, various semiconductor chips such as microcomputers other than high-speed DRAMs can be used, and the freedom of the constitution of semiconductor devices can be enhanced. In this case, as FIG. 2 shows, through-holes 17 can be formed on the circumference of the substrate 4a, additional conductive balls 7 can be disposed on the back of the substrate 4, and the conductive balls 7 can be connected directly to bonding fingers whereto the gold wires 5 are connected through the through-holes 17. Thereby, input and output to and from the semiconductor chips 2 and 3 can be made independent through additional conductive balls 7, and the wiring path from the back of the substrate 4 to the semiconductor chips 2 and 3 can be shortened.

MODIFIED EXAMPLE 2

Figure 3:
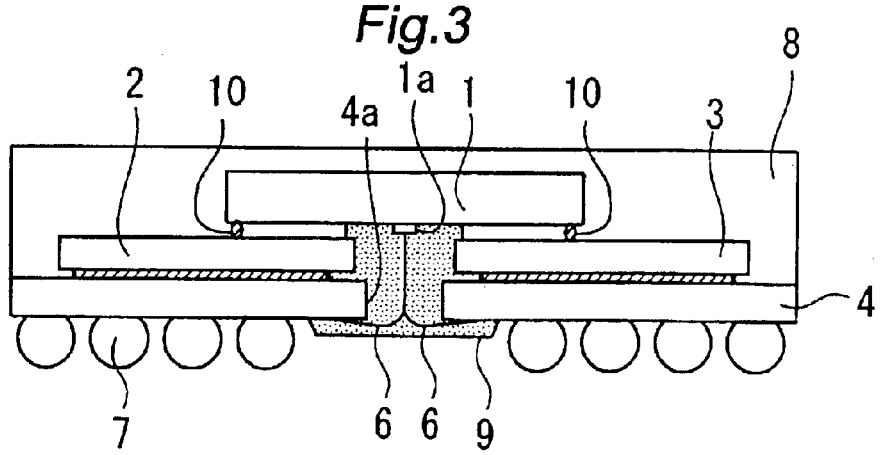
FIG. 3 is a schematic sectional view showing Modified Example 2 of First Embodiment.

FIG. 3 is a schematic sectional view showing Modified Example 2 of First Embodiment. Modified Example 2 is a semiconductor device wherein semiconductor chip 1 is electrically connected to semiconductor chips 2 and 3 with bumps 10. The lower surface of the semiconductor chip 1 is provided with circumferential pads (not shown in FIG. 3) for connecting bumps, and the center pads of the semiconductor chips 2 and 3 are connected to the pad for connecting to the bump of the semiconductor chip 1 through the bumps 10.

According to Modified Example 2, since there is no need to provide the gold wire 5 in FIG. 1, the cause of the fall or flow of the gold wire itself can be eliminated. Also, there is no need to provide wiring patterns for connecting to gold wires on the upper surface of the substrate 4. Thereby, difference in operation speed between semiconductor chips 1, 2, and 3 can be reduced, and the occurrence of timing difference in signals to each semiconductor chip can be prevented. In FIG. 3, although semiconductor chips 2 and 3 are the chips of center pad specifications, chips of other than center pad specifications may also be used.

MODIFIED EXAMPLE 3

Figure 4A:
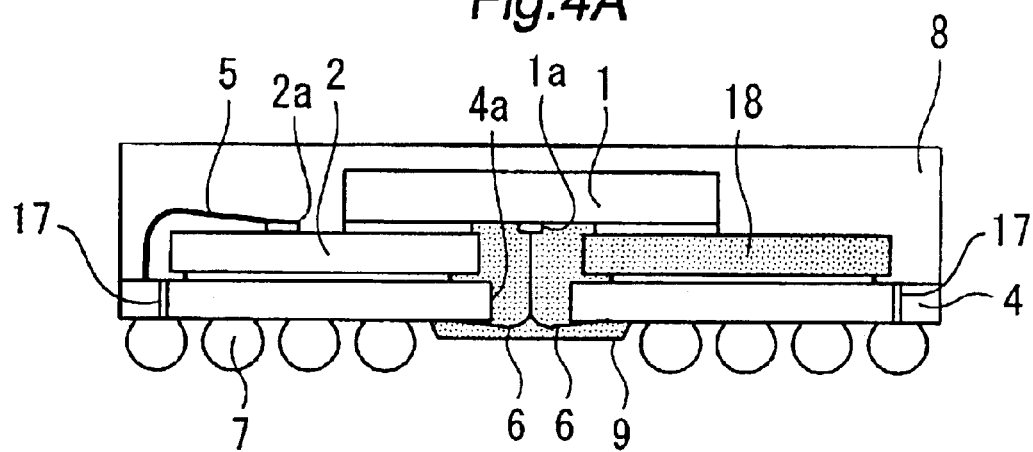
FIG. 4A and FIG. 4B are schematic sectional views showing Modified Example 3 of First Embodiment.
Figure 4B:
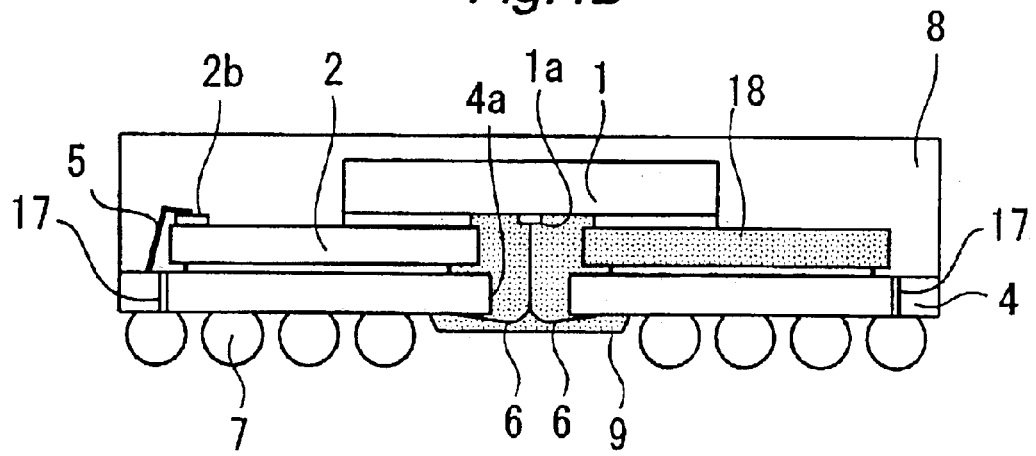

FIG. 4A and FIG. 4B are schematic sectional views showing Modified Example 3 of First Embodiment. Modified Example 3 is a semiconductor device wherein at least one of the semiconductor chips 2 and 3 is replaced by a dummy chip 18 that does not actually operate.

FIG. 4A shows an example wherein the semiconductor chip 3 of First Embodiment shown in FIG. 1 is replaced by a dummy chip 18. FIG. 4B shows an example wherein the semiconductor chip 3 of Modified Example 1 shown in FIG. 2 is replaced by a dummy chip 18.

According to Modified Example 3, even in the case where there is no need of disposing two semiconductor chips underneath the semiconductor chip 1 in the device constitution, the semiconductor chip 1 can be supported from the bottom by disposing the dummy chip 18. Therefore, the structure of First Embodiment can be realized without the limitation of the device constitution.

MODIFIED EXAMPLE 4

Figure 5:
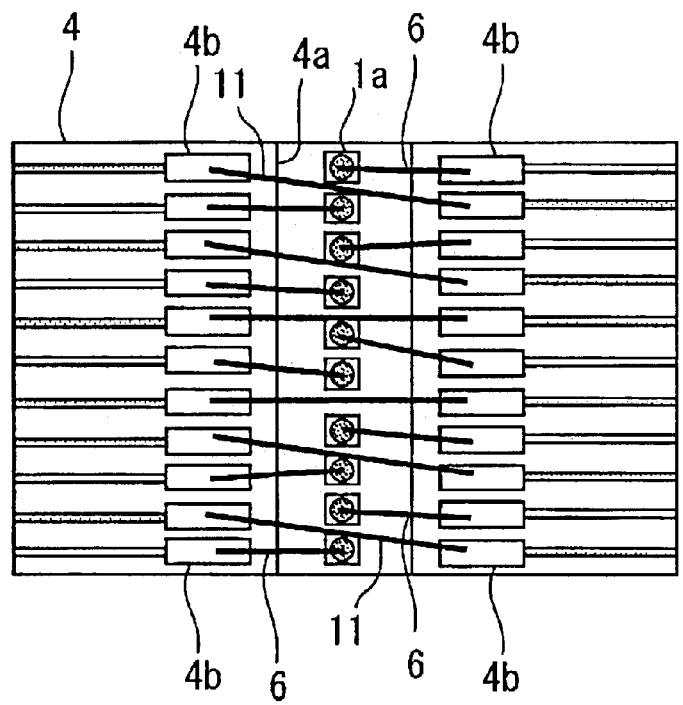
FIG. 5 is a schematic sectional view showing Modified Example 4 of First Embodiment.

FIG. 5 is a schematic sectional view showing Modified Example 4 of First Embodiment. FIG. 5 is a plan showing the surroundings of the opening 4a of the substrate 4 of the semiconductor device shown in FIG. 1 in detail, and is a bottom view of the state before the package is sealed by the resin. As FIG. 5 shows, the gold wire 6 drawn from the center pad 1a is connected to a bonding finger 4b of the substrate 4, and the bonding finger 4b is connected to the pattern or the like whereon conductive balls 7 are disposed. In this constitution, Modified Example 4 is an example wherein bonding fingers 4b facing to each other through the opening 4a are connected by wire bonding with gold wires 11. Thereby, the freedom of wiring drawing on the substrate 4 can be enhanced, and even in the case where the opening 4a is formed in the substrate 4, a desired wiring path can be provided on the substrate 4. And the wiring drawing to conductive balls 7 for external connection can be facilitated.

MODIFIED EXAMPLE 5

Figure 6:
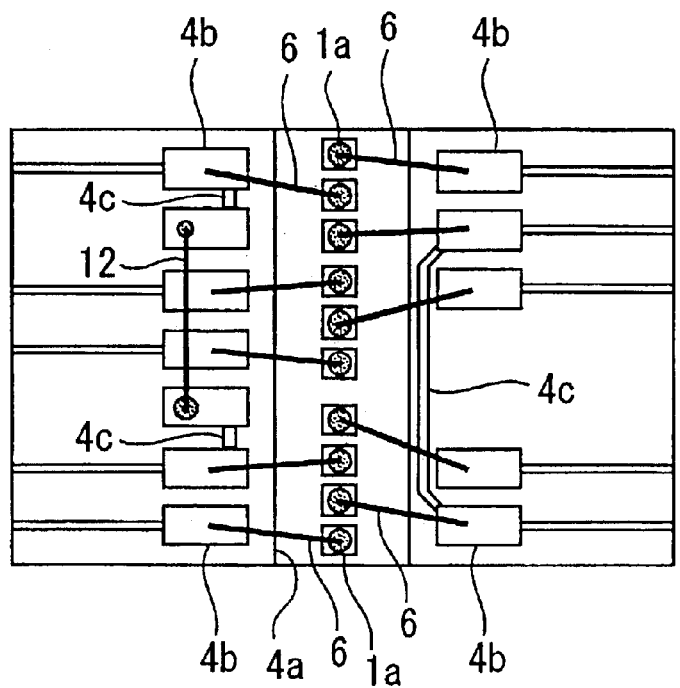
FIG. 6 is a schematic sectional view showing Modified Example 5 of First Embodiment.

FIG. 6 is a schematic sectional view showing Modified Example 5 of First Embodiment. FIG. 6 is a plan showing the surroundings of the opening 4a of the substrate 4 of the semiconductor device shown in FIG. 1 similarly to FIG. 5, and is a bottom view of the state before the package is encapsulated with the resin. In Modified Example 5, predetermined bonding fingers 4b arranged side by side are connected by wire bonding with gold wires 12. According to Modified Example 5, even in the case where wiring drawing on the substrate 4 is difficult due to the space or the like, the freedom of wiring can be enhanced, and a desired wiring path can be provided on the substrate 4 by wire bonding with gold wires 12.

MODIFIED EXAMPLE 6

FIG. 6 shows Modified Example 6 together with Modified Example described above. In Modified Example 6, a connecting pattern 4c is formed using the space between the opening 4a and the bonding fingers 4b, and the predetermined bonding fingers 4b are connected to each other with the connecting pattern 4c. According to Modified Example 6, even in the case where wiring drawing on the substrate 4 is difficult due to the space or the like, a desired wiring path can be provided on the substrate 4 by forming the connecting pattern 4c.

Figure 15:
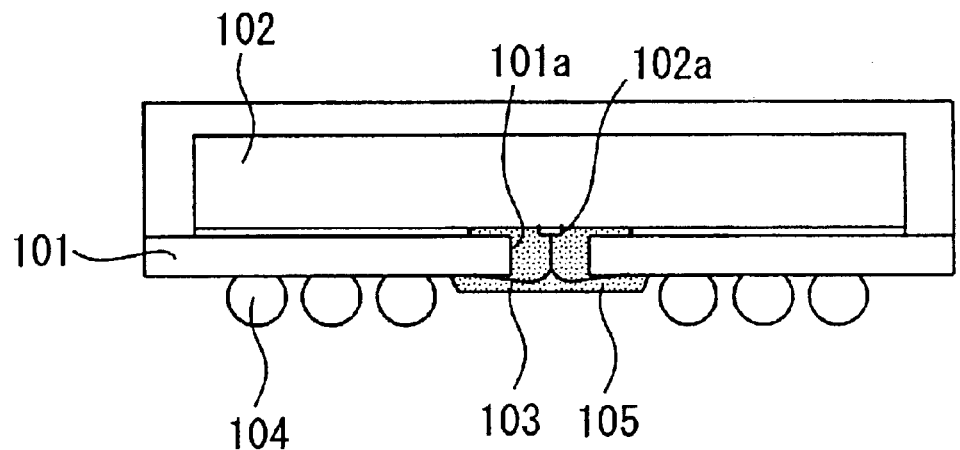
FIG. 15 is a schematic sectional view showing a package using a BOC structure.
Figure 16:
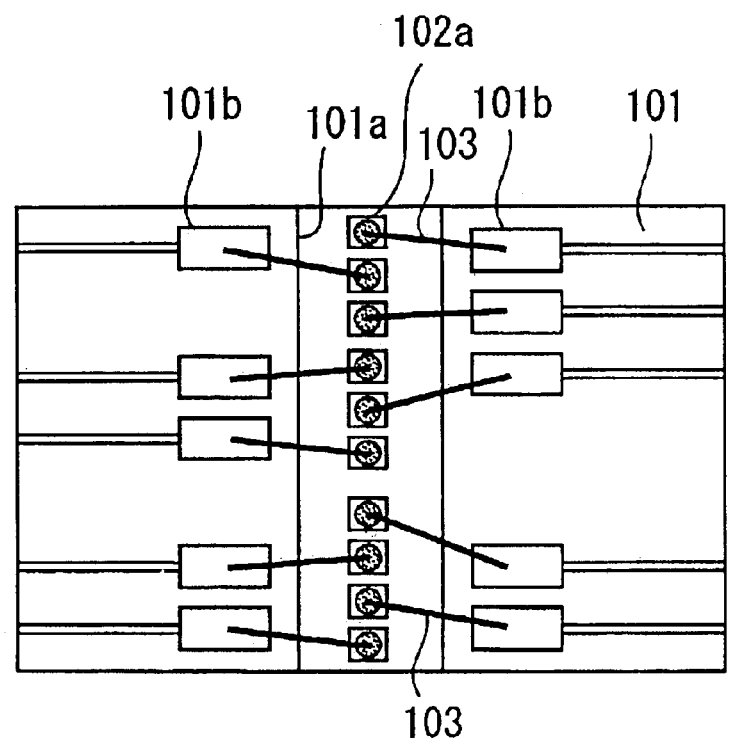
FIG. 16 is a plan showing the surroundings of the opening viewed from the bottom before the package of FIG. 15 is resin-sealed.
Figure 17:
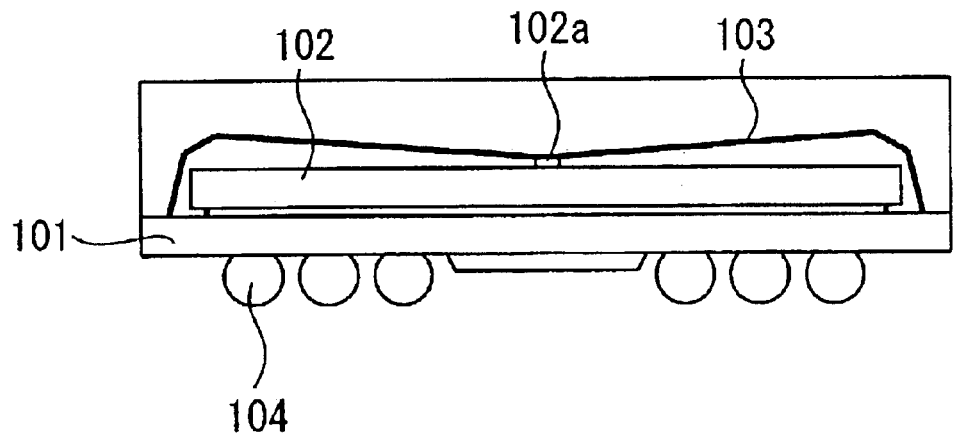
FIG. 17 is a schematic sectional view showing a substrate-type package.
Figure 18:
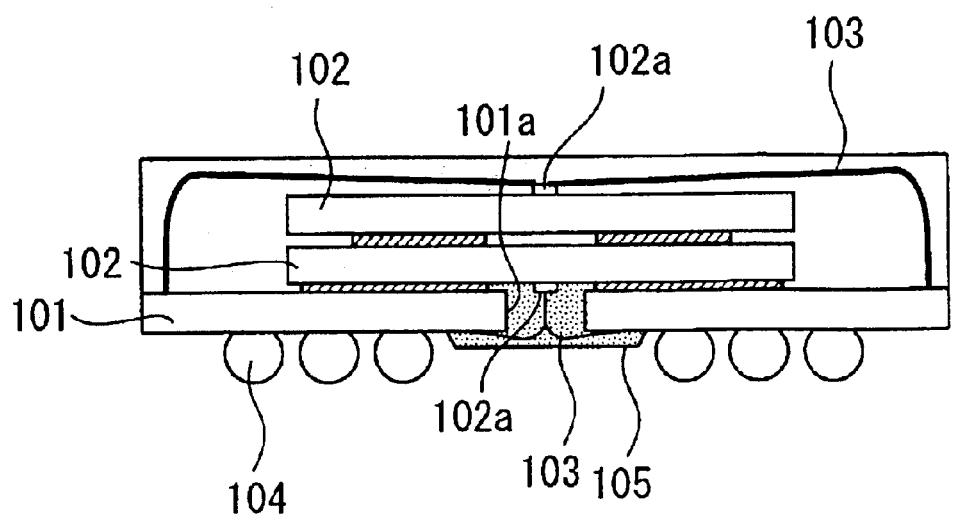
FIG. 18 is a schematic sectional view showing a multi-chip package using a BOC structure.

When Modified Examples 4 to 6 described above are applied to chips of a conventional BOC structure shown in FIG. 15, the freedom of wiring drawing can be enhanced.

Second Embodiment

Figure 7:
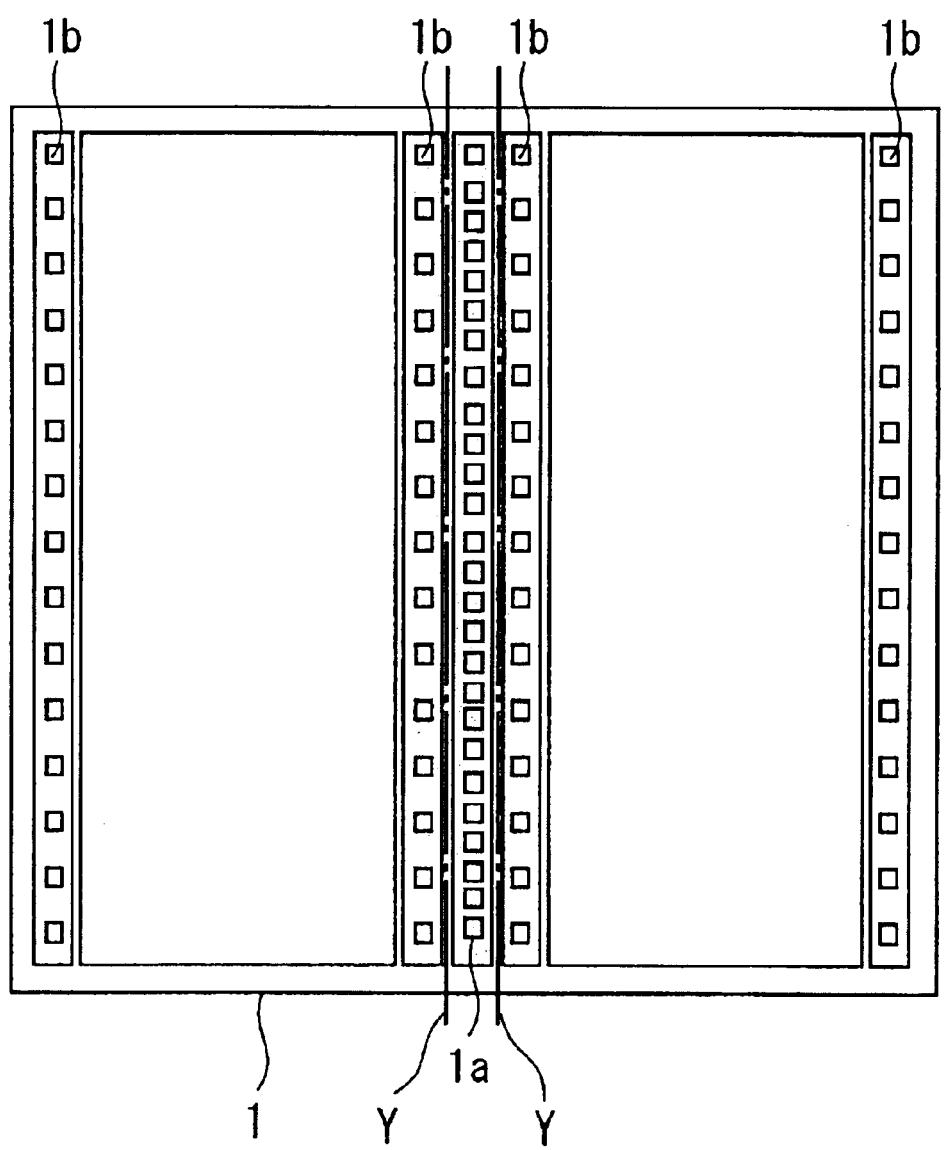
FIG. 7 is a plan showing the semiconductor chip according to Second Embodiment.

Next, Second Embodiment of the present invention will be described referring to FIGS. 7 to 10. In Second Embodiment, the semiconductor chips 1, 2, and 3 in First Embodiment can be manufactured using the same process. FIG. 7 is a plan showing the semiconductor chip 1. The semiconductor chip 1 is a large-capacity chip such as DRAM having a center pad 1a formed on the center thereof, and the chip shown here has a capacity of 512 megabits (Mb). When the semiconductor chip 1 is diced along two dashed lines Y shown in FIG. 7, it is split into two semiconductor chips. One becomes the semiconductor chip 2 in First Embodiment, and the other becomes the semiconductor chip 3. The capacity of both the semiconductor chip 2 and the semiconductor chip 3 after splitting is 256 megabits. If the capacity of the semiconductor chip 1 is 1 gigabit (Gb), the capacity of both the semiconductor chip 2 and the semiconductor chip 3 after splitting becomes 512 megabits. In order to be used as individual chips after splitting, pads 1b have been provided on the both sides of the center pads 1a of the semiconductor chip 1 and a part of the outer edges from the stage of wafer processing. The pads 1b have been so constituted as to be circumferential pads 2b and 3b illustrated in FIG. 2 after dicing.

Figure 8:
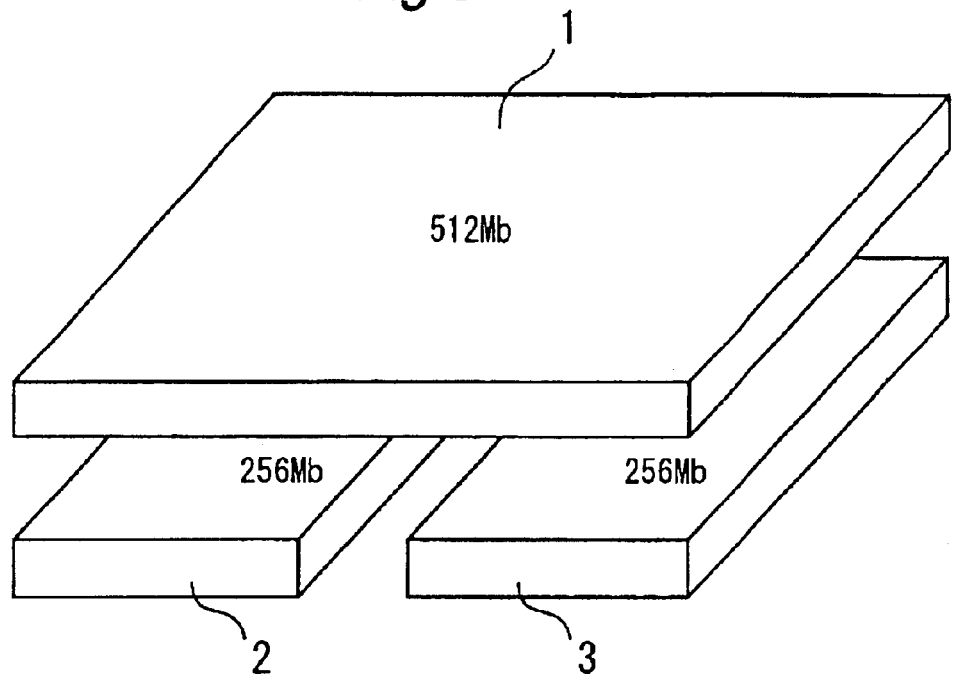
FIG. 8 is a schematic diagram showing the arrangement of the semiconductor chip 1 in FIG. 7 and the semiconductor chips obtained by dicing.

FIG. 8 is a schematic diagram showing the arrangement of the semiconductor chip 1 in FIG. 7 and the semiconductor chips 2 and 3 obtained by dicing. Thus, since the size of the semiconductor chips 2 and 3 is about a half the size of the semiconductor chip 1, the plane region of the semiconductor chip 1 is substantially equal to the plane region of the semiconductor chips 2 and 3, the semiconductor chip 1 can be disposed in a suitable manner on the plane region of the semiconductor chips 2 and 3.

Figure 9:
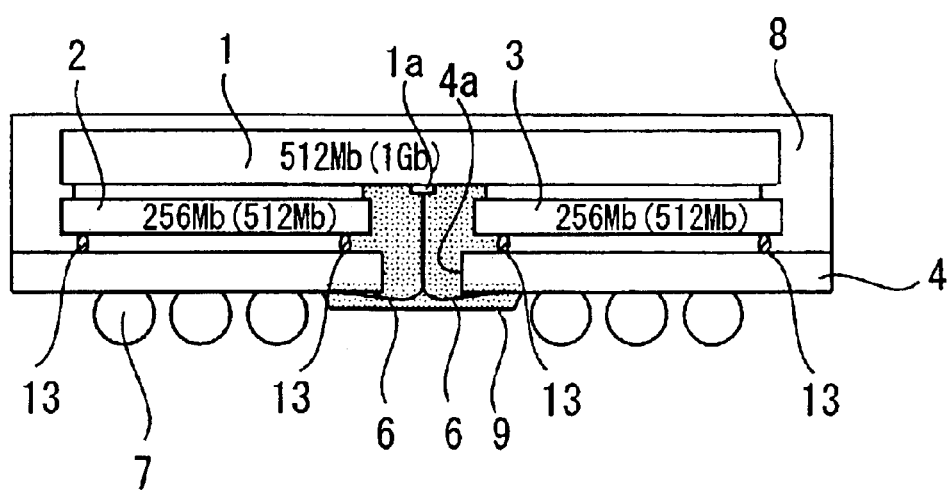
FIG. 9 is a schematic sectional view showing a multi-chip package of a BOC structure constituted using the semiconductor chips shown in FIG. 8.
Figure 10:
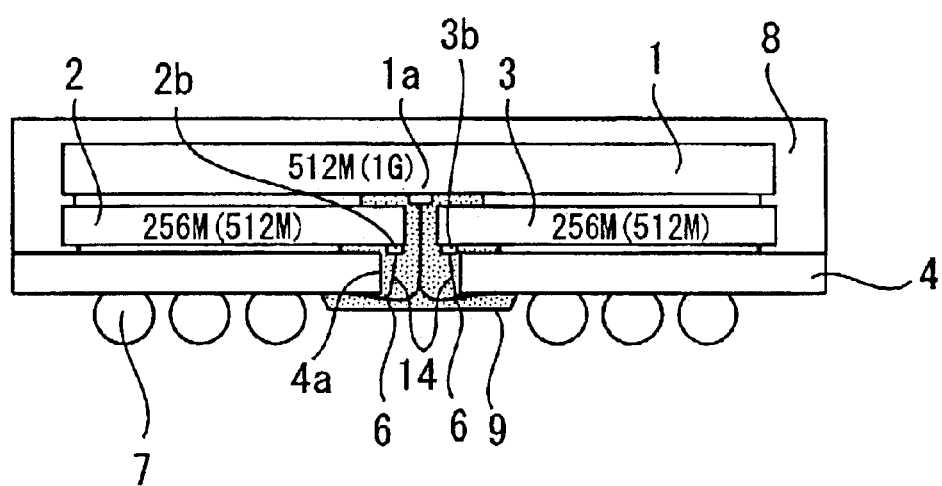
FIG. 10 is a schematic sectional view showing a multi-chip package of a BOC structure constituted using the semiconductor chips shown in FIG. 8.

FIGS. 9 and 10 are schematic sectional views showing a multi-chip package of a BOC structure constituted using the semiconductor chips 1, 2, and 3 shown in FIG. 8. As FIGS. 9 and 10 show, semiconductor chips 2 and 3 are die-bonded on the both sides of the opening 4a on the substrate 4, and a semiconductor chip 1 is die-bonded on the semiconductor chips 2 and 3. Here, in FIG. 9, since the circumferential pad of the semiconductor chips 2 and 3 are connected to the substrate 4 with bumps 13 to shorten the wiring path, the package is especially suited for devices of high-speed operation. In FIG. 10, the circumferential pads 2b and 3b of the semiconductor chips 2 and 3 are electrically connected to lower surface of the substrate 4 with gold wires 14.

According to Second Embodiment, the semiconductor chips 1, 2, and 3 can be manufactured in the same wafer process. Therefore, the costs for manufacturing a semiconductor device can be reduced significantly.

Third Embodiment

Next, referring to FIGS. 11 to 14, Third Embodiment of the present invention will be described. Third Embodiment is a semiconductor device similar to First Embodiment wherein a sealing resin 9 is surely formed by transfer molding even if the width of the opening 4a of the substrate 4 is widened.

Depending upon the constitution of a semiconductor device, the width of the opening 4a of the substrate 4 may have to be widen due to the circuit constitution or other reasons. On the other hand, the positions of the conductive balls 7 disposed on the back of the substrate 4 is limited by the pattern arrangement on the back of the substrate 4, the locations of pads of parts to be connected, or the like, and even if the width of the opening 4a is widened, there may be the case where the positions of the conductive balls 7 cannot be changed. In this case, there may be limitation in the sealing by the sealing resin 9 depending on the width of the opening 4a.

Figure 11A:
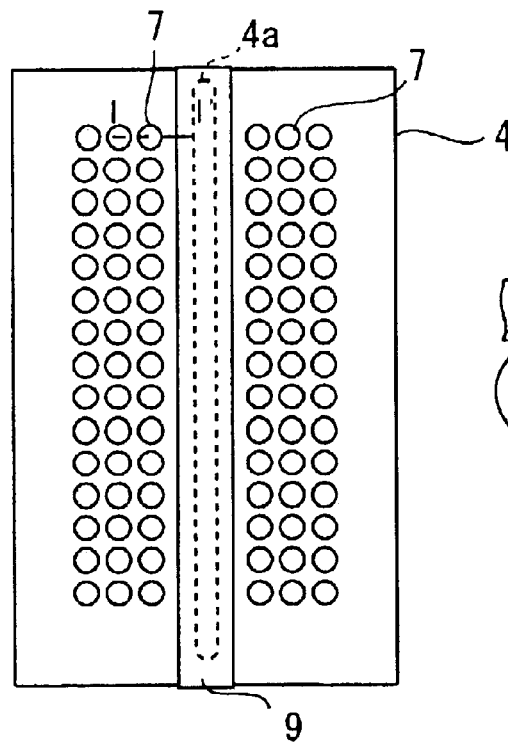
FIG. 11A is a plan showing the lower surface of the semiconductor device of FIG. 1.
Figure 11B:
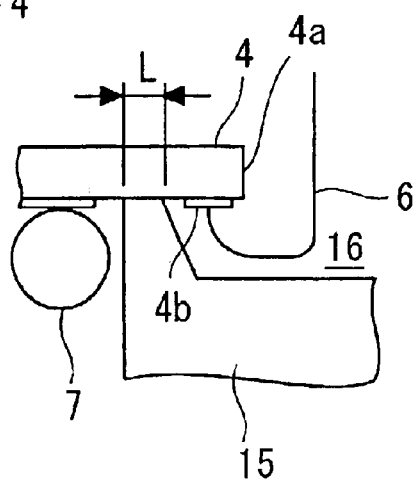
FIG. 11B is a sectional view along the line I–I' in FIG. 11A.
Figure 12A:
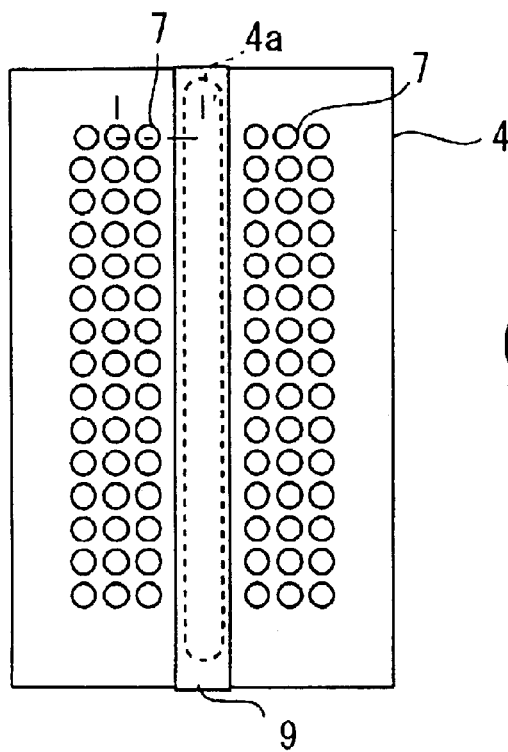
FIG. 12A is a plan showing the lower surface of the semiconductor device of FIG. 1.
Figure 12B:
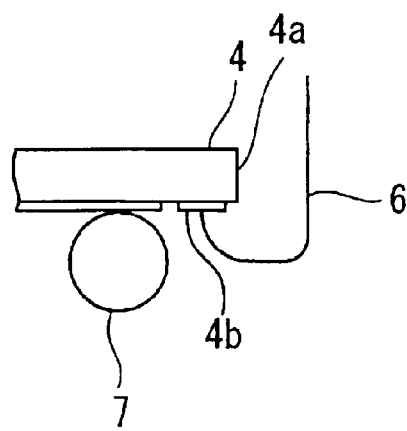
FIG. 12B is a sectional view along the line I–I' in FIG. 12A.

First, referring to FIGS. 11 and 12, the positional relationship between the sealing resin 9 and conductive balls 7 when the width of the opening 4a is widened. Here, FIG. 11A and FIG. 12A are plans showing the lower surface of the semiconductor device of FIG. 1, FIG. 11B is a sectional view along the line I–I' in FIG. 11A, and FIG. 12B is a sectional view along the line I–I' in FIG. 12A. FIG. 11 shows the case where the width of the opening 4a is sufficiently narrow. In this case, since a sufficient space is present between the edge of the opening 4a and the conductive balls 7 disposed along the opening 4a, the sufficient region where the molding die 15 contacts the substrate 4 (margin for directing the die, L) can be secured when resin sealing is performed as shown in FIG. 11B. Therefore, bonding fingers 4b can be sealed surely by flowing the sealing resin 9 in the space 16 between the molding die 15 and the substrate 4.

On the other hand, FIG. 12 shows the state where the width of the opening 4a is widened, and the edges of the opening 4a approach the conductive balls 7. In this case, since the space between the opening 4a and the conductive balls 7 is narrowed, and the bonding fingers 4b approach the conductive balls 7, the margin for directing the die, L, becomes insufficient.

In Third Embodiment, the bonding fingers 4b are disposed on the adequate positions relative to the conductive balls 7 to secure the margin for directing the die, L, even in the case shown in FIG. 12.

Figure 13:
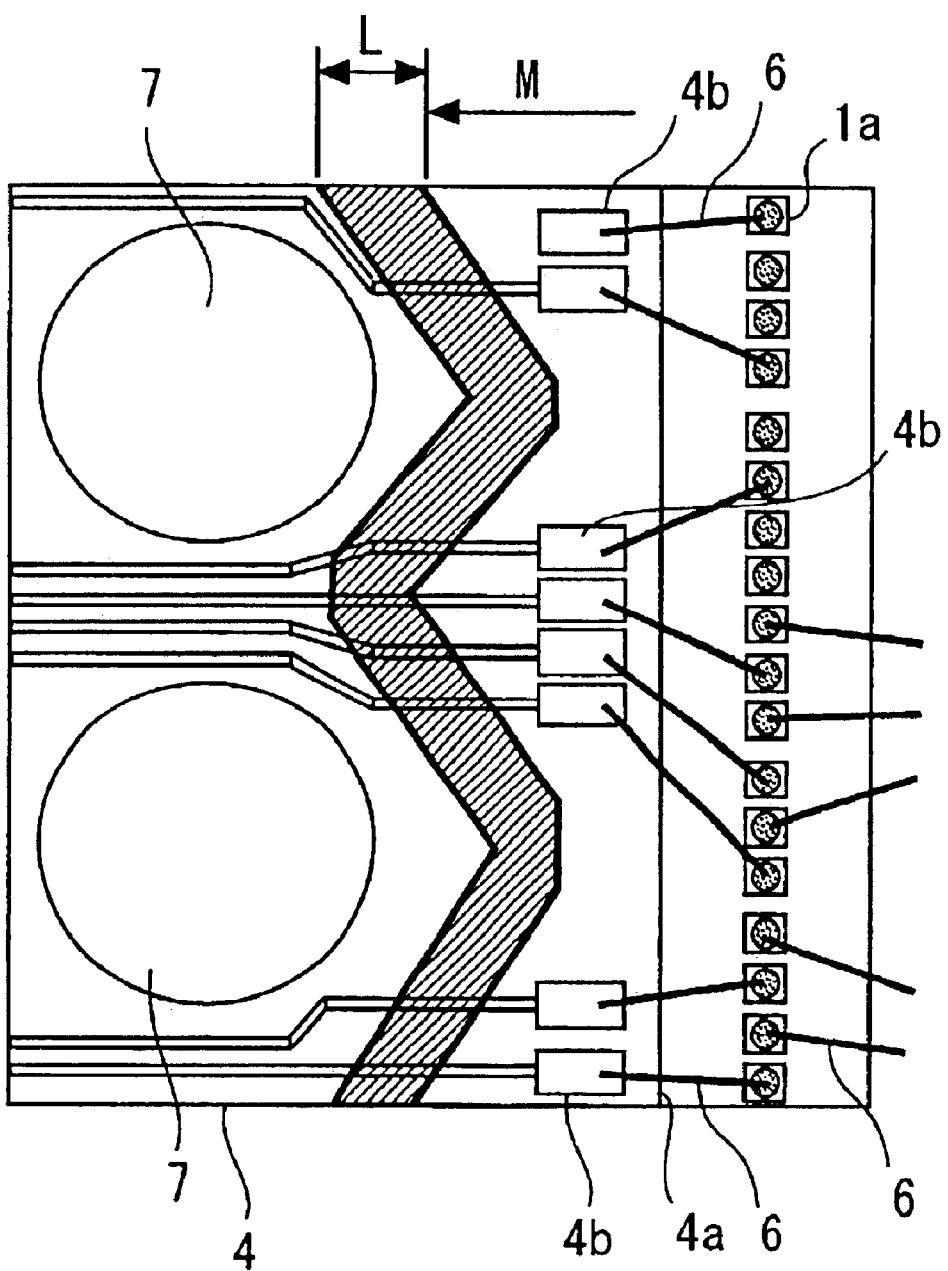
FIG. 13 is an enlarged plan showing the vicinity of the opening of the substrate in the semiconductor device according to Third Embodiment.

FIG. 13 is an enlarged plan showing the vicinity of the opening 4a of the substrate 4 in the semiconductor device according to Third Embodiment, and shows the state before sealing with the sealing resin 9. As FIG. 13 shows, the conductive balls 7 are disposed along the edge of the opening 4a, and bonding fingers 4b are disposed between the region where the conductive balls 7 are disposed and the edge of the opening 4a. In the direction along the edge of the opening 4a, a plurality of bonding fingers 4b are disposed between the conductive balls 7 adjacent to each other.

Thereby, a sufficient space can be secured between the conductive balls 7 and the bonding fingers 4b, and the margin for directing the die, L, can be secured in this space. In this case, as shown by hatching in FIG. 13, the region of the margin for directing the die, L, is the zigzag region between the conductive balls 7 and the bonding fingers 4b. By contacting the molding die 15 to the margin for directing the die, L, the region M between the margin for directing the die, L, and the opening 4a can be filled with the sealing resin 9.

Figure 14:
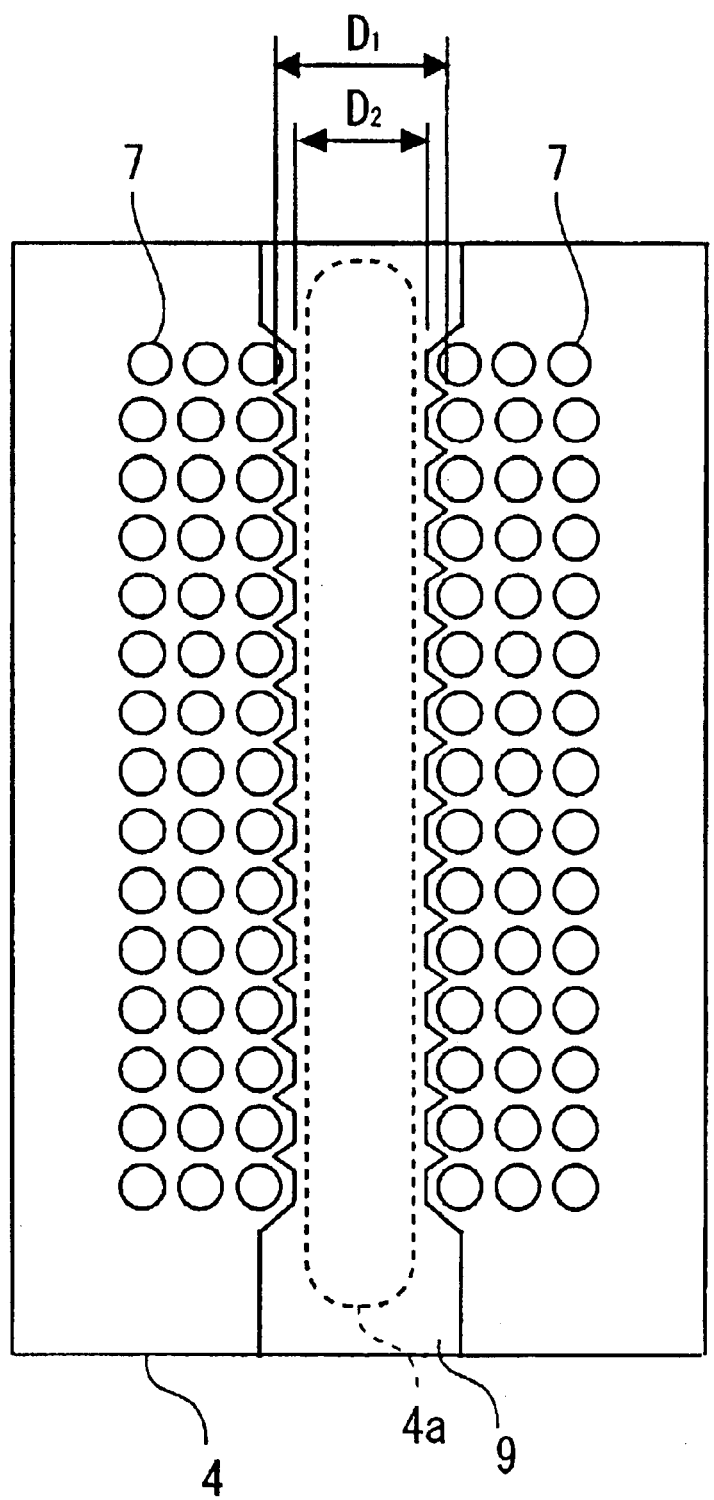
FIG. 14 is a schematic diagram showing a semiconductor device according to Third Embodiment.

FIG. 14 is a schematic diagram showing a semiconductor device according to Third Embodiment, and is a plan showing the lower surface of the substrate 4. By establishing the region of the margin for directing the die, L, as FIG. 13 shows, the width of the formed sealing resin 9 differs between the location approaching the conductive balls 7 and the location covering the bonding fingers 4b. It is preferable here to form the sealing resin 9 so that the difference between the width $D_1$ of the location covering the bonding fingers 4b and the width $D_2$ of the location approaching the conductive balls 7 becomes 0.2 mm or more. It is thereby ensured that the bonding fingers 4b disposed between conductive balls 7 adjacent to each other can be covered with the sealing resin 9.

According to Third Embodiment, even if the width of the opening 4a of the substrate 4 is widened, and the bonding fingers 4b approach the conductive balls 7, the margin for directing the die, L, can be secured, and the bonding fingers 4b can be covered and sealed with the sealing resin 9. Therefore, in the case, for example, the circumferential pads 2b and 3b of the semiconductor chips 2 and 3 are connected to the bonding fingers 4b on the back of the substrate 4 with gold wires 14, the width of the opening 4a must be widened so as to pass both gold wires 6 and gold wires 14 as FIG. 10 shows; however, even in this case, the margin for directing the die, L, can be secured, and resin sealing can be performed.

Third Embodiment can also be applied to the case where the width of the opening in the semiconductor device shown in FIG. 15 increases, and by securing the margin for directing the die, L, the bonding fingers can be sealed surely with the sealing resin 9.

Since the present invention is constituted as described above, the present invention exerts the effects as described below.

Since the first wiring is passed between the first semiconductor chips adjacent to each other and through the opening of the substrate, and the first wiring is drawn from the second semiconductor chip to the second conductive pattern on the substrate, the wiring path can be shortened to a minimum length. Thereby, the short-circuiting of the first wirings adjacent to each other can be prevented, the short-circuiting of the first wirings and the edge of the semiconductor chip can be prevented, and the reliability of the semiconductor device can be improved. Also by shortening the wiring path to a minimum length, a semiconductor device of the structure advantageous for raising the speed can be constituted.

Since a plurality of first pads whereto the first wirings are connected are disposed along the direction that the opening extends, a large number of first wirings can be passed through the opening.

Since a plurality of first pads are disposed along the center line of the second semiconductor chip, a semiconductor device can be constituted using the second semiconductor chip of center pad specifications.

Since the second wiring electrically connecting the first semiconductor chip to the first conductive pattern is provided, the first semiconductor chip can be connected to the first conductive pattern using wire bonding.

Since a plurality of pads whereto the second wirings are connected are provided on the circumferential portion of the first semiconductor chip, the wiring path of the second wirings can be shortened to a minimum length. Therefore, the short-circuiting of the second wirings adjacent to each other can be prevented, the short-circuiting of the second wirings and the edge of the semiconductor chip can be prevented, and the reliability of the semiconductor device can be improved. Also by shortening the wiring path to a minimum length, a semiconductor device of the structure advantageous for raising the speed can be constituted. Furthermore, since the length of the first wirings can be substantially the same as the length of the second wirings, the occurrence of the timing difference of signals between the first semiconductor chip and the second semiconductor chip can be prevented.

Since a through-hole is provided in the vicinity of the portion where the second wiring is connected to the first conductive pattern, the wiring path from the first semiconductor chip to the second conductive pattern can be shortened, and the input to and the output from the first semiconductor chip through the second conductive pattern can be made independent.

Since the bumps electrically connecting the first semiconductor chip to the second semiconductor chip are provided therebetween, the wiring path from the first semiconductor chip to the second semiconductor chip can be shortened to a minimum length.

Since the first semiconductor chip can be formed by splitting a chip of the same as the second semiconductor chip, the first and the second semiconductor chips can be manufactured in the same wafer process. Thereby, the costs for manufacturing a semiconductor device can be reduced significantly.

Since a third wiring whose one end is connected to the first semiconductor chip and the other end is connected to the second conductive pattern is provided, and the third wiring is passed through the opening, the wiring path for the third wirings can be shortened to a minimum length.

Since third pads whereto a plurality of third wirings are connected are provided on the circumferential portion of the first semiconductor chip, the wiring path for the third wirings can be shortened to a minimum length.

Since bumps for electrically connecting the first semiconductor chip to one surface of the substrate are provided therebetween, the wiring path from the first semiconductor chip to the substrate can be shortened to a minimum length.

Since third wirings for connecting at least two of a plurality of bonding patterns are provided, the freedom of wiring drawing can be enhanced, and a desired wiring path can be provided on the substrate.

Since the bonding patterns facing to each other through the opening are connected with the third wirings, a desired wiring path can be provided on the substrate even if an opening is provided on the substrate.

Since a connecting pattern that connects at least two of a plurality of bonding patterns is provided, and the connecting pattern is provided between the bonding pattern and the edge of the opening, a desired wiring path can be provided on the substrate even if the wiring drawing on the substrate is difficult.

Since a bonding pattern is formed in the region between the region whereon the conductive balls are disposed and the edge of the opening, and one or more bonding patterns are positioned between two conductive balls adjacent to each other in the direction that the opening extends, the bonding pattern can be disposed even if the space between the conductive balls and the opening is small.

Since the width of the sealing resin in the portion close to conductive balls is made narrower than the width of the portion to cover the bonding patters, a space can be made between the conductive balls and the sealing resin. Thereby, the margin for holding the die for molding the sealing resin can be secured around the conductive balls.

Since the width of the sealing resin in the portion close to the conductive balls is made narrower than the width of the portion to cover the bonding pattern by 0.2 mm or more, the margin for holding the die can be secured.

Since at least one of the first semiconductor chips is made a dummy chip, a semiconductor device can be constituted even in the case where there is no need to dispose two first semiconductor chips underneath the second semiconductor chip in the device constitution.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-219909, filed on Jul. 29, 2002 including specification, claims, drawings and summary, on which the Convention priority of the present application is based, are incorporated herein by reference in its entirety.

What is claimed is:

1. A semiconductor device wherein a plurality of semiconductor chips are mounted on a substrate, comprising a first conductive pattern provided on one surface of said substrate;

a second conductive pattern provided on the other surface of said substrate;

at least two first semiconductor chips mounted on one surface of said substrate, and connected to said first conductive pattern;

a second semiconductor chip mounted so as to stride on said first semiconductor chips adjacent to each other; and a first wiring passing between said first semiconductor chips adjacent to each other, and through an opening formed in said substrate, an end thereof being connected to the surface of said second semiconductor chip facing said substrate, and the other end being connected to said second conductive pattern.

2. The semiconductor device according to claim 1, further comprising a plurality of first pads provided on the surface of said second semiconductor chip facing said substrate, whereto a plurality of said first wirings are connected respectively, wherein said opening is present along the gap between said first semiconductor chips adjacent to each other, and said plurality of first pads are disposed along the direction of the presence of said opening.

3. The semiconductor device according to claim 2, wherein said plurality of first pads are disposed along the center line of said second semiconductor chip.

4. The semiconductor device according to claim 1, further comprising a second wiring that electrically connects said first semiconductor chip to said first conductive pattern.

5. The semiconductor device according to claim 4, wherein said first semiconductor chip comprises on the circumferential portion of the chip surface a plurality of pads whereto a plurality of said second wirings are connected.

6. The semiconductor device according to claim 4, wherein a through hole for connecting said first conductive pattern to said second conductive pattern is provided on said substrate in the vicinity of a connecting portion of said second wiring and said first conductive pattern.

7. The semiconductor device according to claim 1, further comprising between said first semiconductor chip and one surface of said substrate a bump for electrically connecting said first semiconductor chip to said first conductive pattern.

8. The semiconductor device according to claim 1, further comprising a plurality of patterns for bonding consisting of said second conductive pattern, whereto a plurality of said first wirings are respectively connected, and a second wiring for connecting at least two of said plurality of patterns for bonding.

9. The semiconductor device according to claim 8, wherein said second wiring connects at least two of said patterns for bonding facing each other through said opening.

10. The semiconductor device according to claim 1, further comprising a plurality of patterns for bonding consisting of said second conductive pattern, whereto a plurality of said first wirings are respectively connected, and a connecting pattern consisting of said second conductive pattern and for connecting at least two of said plurality of patterns for bonding, wherein said connecting pattern is provided between said patterns for bonding and the edge of said opening.

11. The semiconductor device according to claim 2, further comprising a plurality of patterns for bonding consisting of said second conductive pattern, whereto a plurality of said first wirings are respectively connected, and a plurality of conductive balls fixed on said second conductive pattern, and disposed along said opening, wherein said patterns for bonding are formed in the region between the area where said plurality of conductive balls are disposed and the edge of said opening, and in the direction of the presence of said opening, one or more of said patterns for bonding is positioned between two of said balls adjacent to each other.

12. The semiconductor device according to claim 11, further comprising a sealing resin for filling the gap between said first semiconductor chips adjacent to each other, and said opening; and formed on said other surface in a width wider than said opening so as to cover said patterns for bonding; wherein the width of said sealing resin in the portion approaching said conductive balls is narrower than the width in the portion to cover said patterns for bonding.

13. The semiconductor device according to claim 12, wherein the width of said sealing resin in the portion approaching said conductive balls is narrower than the width in the portion to cover said patterns for bonding by 0.2 mm or more.

14. The semiconductor device according to claim 1, wherein at least one of said first semiconductor chips is a dummy chip.

15. A semiconductor device wherein a semiconductor chip is mounted on a substrate, comprising a conductive pattern provided on one surface of said substrate;

a semiconductor chip mounted on the other surface of said substrate;

a first wiring passing through an opening formed in said substrate, an end thereof being connected to the surface of said semiconductor chip facing said substrate, and the other end being connected to said conductive pattern;

a plurality of patterns for bonding consisting of said conductive pattern, whereto a plurality of said first wirings are respectively connected, and a second wiring for connecting at least two of said plurality of patterns for bonding.

16. The semiconductor device according to claim 15, wherein said second wiring connects at least two of said patterns for bonding facing each other through said opening.

17. A semiconductor device wherein a semiconductor chip is mounted on a substrate, comprising a conductive pattern provided on one surface of said substrate;

a semiconductor chip mounted on the other surface of said substrate;

a wiring passing through an opening formed in said substrate, an end thereof being connected to the surface of said semiconductor chip facing said substrate, and the other end being connected to said conductive pattern;

a plurality of patterns for bonding consisting of said conductive pattern, whereto a plurality of said wirings are respectively connected; and a connecting pattern consisting of said conductive pattern, and for connecting at least two of said plurality of patterns for bonding; wherein said connecting pattern is provided between said patterns for bonding and the edge of said opening.

18. A semiconductor device wherein a semiconductor chip is mounted on a substrate, comprising a conductive pattern provided on one surface of said substrate;

a semiconductor chip mounted on the other surface of said substrate;

a wiring passing through an opening formed in said substrate, an end thereof being connected to the surface of said semiconductor chip facing said substrate, and the other end being connected to said conductive pattern;

a plurality of patterns for bonding consisting of said conductive pattern, whereto a plurality of said wirings are respectively connected; and a plurality of conductive balls fixed on said conductive pattern, and disposed along said opening, wherein said patterns for bonding are formed in the region between the area where said plurality of conductive balls are disposed and the edge of said opening, and in the direction of the presence of said opening, one or more of said patterns for bonding is positioned between two of said balls adjacent to each other.

19. The semiconductor device according to claim 18, further comprising a sealing resin for filling said opening, and formed on said other surface in a width wider than said opening so as to cover said patterns for bonding; wherein the width of said sealing resin in the portion approaching said conductive balls is narrower than the width in the portion to cover said patterns for bonding.

20. The semiconductor device according to claim 19, wherein the width of said sealing resin in the portion approaching said conductive balls is narrower than the width in the portion to cover said patterns for bonding by 0.2 mm or more.

* * * * *